(12) United States Patent
Peng et al.

(10) Patent No.: US 12,087,557 B2
(45) Date of Patent: Sep. 10, 2024

(54) SUBSTRATE PROCESSING SYSTEM INCLUDING COIL WITH RF POWERED FARADAY SHIELD

(71) Applicant: LAM RESEARCH CORPORATION, Fremont, CA (US)

(72) Inventors: Shen Peng, Dublin, CA (US); Tamarak Pandhumsoporn, Fremont, CA (US); Anthony Nguyen, Pleasanton, CA (US); Dan Marohl, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 871 days.

(21) Appl. No.: 17/016,888

(22) Filed: Sep. 10, 2020

(65) Prior Publication Data
US 2020/0411297 A1    Dec. 31, 2020

Related U.S. Application Data

(62) Division of application No. 15/467,588, filed on Mar. 23, 2017, now abandoned.
(Continued)

(51) Int. Cl.
*H01L 21/306*    (2006.01)
*C23C 16/00*    (2006.01)
(Continued)

(52) U.S. Cl.
CPC ...... *H01J 37/32651* (2013.01); *H01J 37/321* (2013.01); *H01J 37/3211* (2013.01);
(Continued)

(58) Field of Classification Search
CPC .............. H01J 37/321; H01J 37/3211; H01J 37/32174; H01J 37/32183; H01J 37/32651
See application file for complete search history.

(56) References Cited

U.S. PATENT DOCUMENTS

| 6,063,234 A | 5/2000 | Chen et al. |
| 6,280,563 B1 * | 8/2001 | Baldwin, Jr. ..... H01J 37/32009 204/298.34 |

(Continued)

FOREIGN PATENT DOCUMENTS

| CN | 101390187 A | 3/2009 |
| WO | WO 01/75930 | * 10/2001 |

(Continued)

OTHER PUBLICATIONS

Translation of the Notification of Office Action dated Aug. 2, 2021 corresponding to Korean Patent Application 10-2017-0038506, 2 pages.

(Continued)

*Primary Examiner* — Luz L Alejandro Mulero

(57) ABSTRACT

A substrate processing system includes a processing chamber including a dielectric window and a substrate support arranged therein to support a substrate. A coil is arranged outside of the processing chamber adjacent to the dielectric window. A Faraday shield is arranged between the coil and the dielectric window. An RF generator is configured to supply RF power to the coil. The coil is coupled by stray capacitance and/or directly coupled to the Faraday shield. A capacitor is connected to one of the coil and the Faraday shield to adjust a position of a voltage standing wave along the coil.

7 Claims, 7 Drawing Sheets

Related U.S. Application Data

(60) Provisional application No. 62/314,059, filed on Mar. 28, 2016.

(51) Int. Cl.
  *H01J 37/32* (2006.01)
  *H01L 21/67* (2006.01)
  *H10N 30/082* (2023.01)

(52) U.S. Cl.
  CPC .. *H01J 37/32174* (2013.01); *H01J 37/32183* (2013.01); *H01J 37/32477* (2013.01); *H01J 37/32504* (2013.01); *H01J 37/32715* (2013.01); *H01L 21/67069* (2013.01); *H01J 2237/334* (2013.01); *H10N 30/082* (2023.02)

(56) References Cited

U.S. PATENT DOCUMENTS

| | | | |
|---|---|---|---|
| 6,422,173 B1 | 7/2002 | Nakajima | |
| 6,442,173 B1 | 8/2002 | Barsoum et al. | |
| 2005/0194355 A1* | 9/2005 | Lohokare | H01J 37/32431 216/68 |
| 2006/0175016 A1* | 8/2006 | Edamura | H01J 37/321 156/345.48 |
| 2007/0170867 A1 | 7/2007 | Persing et al. | |
| 2018/0061681 A1* | 3/2018 | Koshimizu | H01L 21/67103 |

FOREIGN PATENT DOCUMENTS

| | | |
|---|---|---|
| WO | WO-0175930 A2 | 10/2001 |
| WO | WO-0175930 A3 | 5/2002 |

OTHER PUBLICATIONS

The Extended European Search Report for European Application No. 17162738.3 dated Aug. 2, 2017.
Translation of Notification of the First Office Action dated May 9, 2020 corresponding to Chinese Patent Application No. 201710193556.0, 11 pages.
Translation of Notification of the Second Office Action dated Jan. 5, 2021 corresponding to Chinese Patent Application No. 201710193556.0, 11 pages.
Translation of Decision of Refusal dated Feb. 19, 2021 corresponding to Taiwanese Application No. 106110091, 5 pages.

* cited by examiner

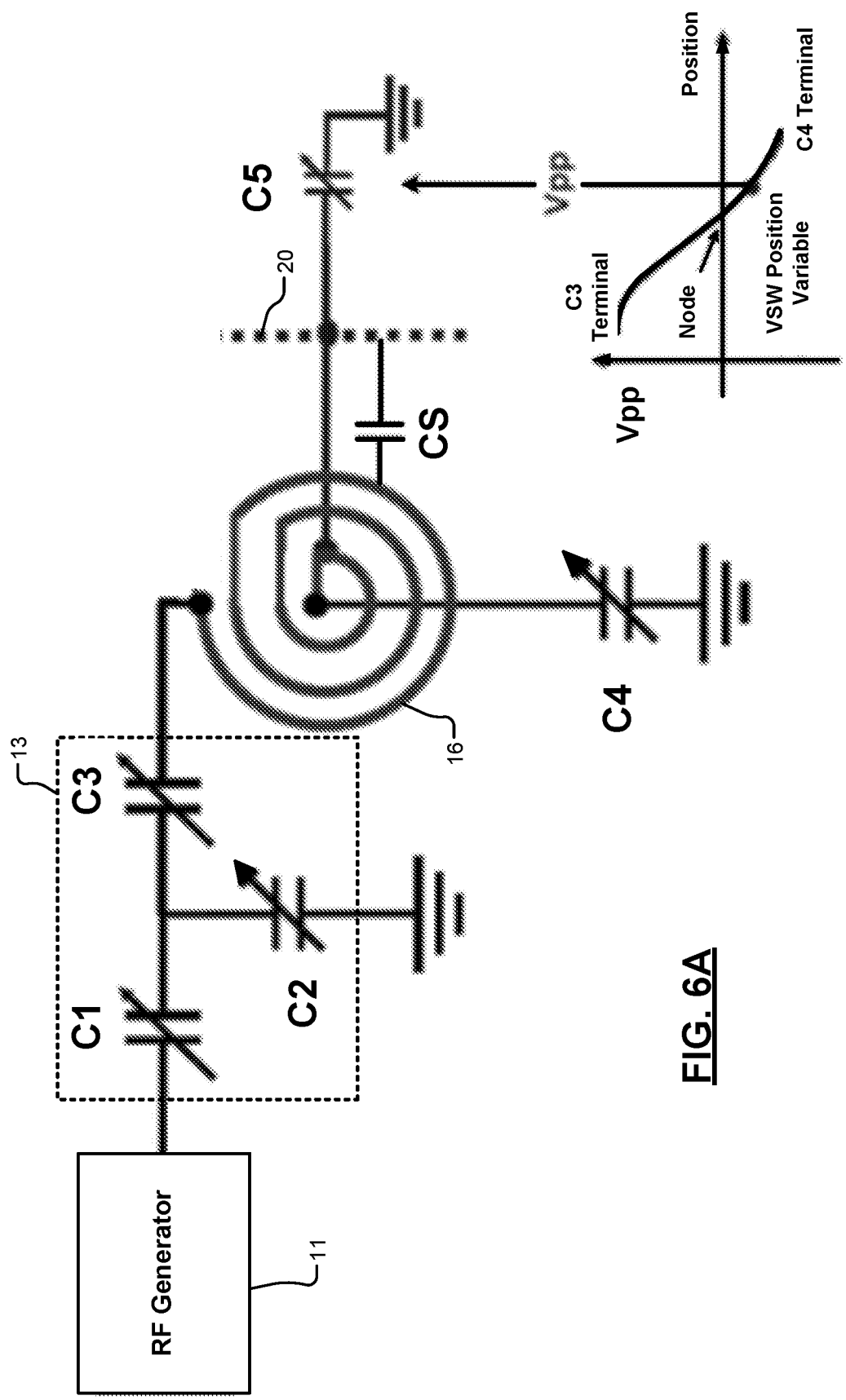

SUBSTRATE PROCESSING SYSTEM INCLUDING COIL WITH RF POWERED FARADAY SHIELD

CROSS-REFERENCE TO RELATED APPLICATIONS

The present disclosure is a divisional of U.S. patent application Ser. No. 15/467,588, filed on Mar. 23, 2017, which claims the benefit of U.S. Provisional Application No. 62/314,059, filed on Mar. 28, 2016. The entire disclosures of the applications referenced above are incorporated herein by reference.

FIELD

The present disclosure relates to substrate processing systems, and more particularly to substrate processing systems including a coil with a radio frequency (RF) powered Faraday shield.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems are typically used to etch thin film on substrates such as semiconductor wafers. Etching usually includes either wet chemical etching or dry etching. Dry etching may be performed using plasma generated by inductively-coupled plasma (ICP). The inductively-coupled plasma may be generated by coils arranged outside of a processing chamber adjacent to a dielectric window. Process gases flowing inside the processing chamber are ignited to create plasma.

Microelectromechanical (MEMS) devices have a wide range of applications including automotive, industrial, biomedical, and information processing. There is an increasing demand for advanced microelectromechanical (MEMS) devices for these and other applications. The advanced MEMS devices have smaller dimensions, improved precision and faster response times. Motion in the MEMS devices is driven by electrostatic or mechanical structures. Integrating piezoelectric films with the MEMS devices provides advantages including enhanced performance, temperature stability, etc.

Piezoelectric film typically includes Wurtzite or Perovski crystal structures. For example, Pervoski lead zirconate titanate (PZT) film has high piezoelectric coefficients and electromechanical coupling when used in MEMS devices. During etching of the PZT film, nonvolatile byproducts are deposited on the dielectric window and other surfaces inside the processing chamber. The nonvolatile byproducts cause process drift over time and reduce repeatability of the etching process. To reduce cost, the process should have a high mean time between cleans (MTBC) with quick chamber recovery.

SUMMARY

A substrate processing system comprises a processing chamber including a dielectric window and a substrate support arranged therein to support a substrate. A coil is arranged outside of the processing chamber adjacent to the dielectric window. A Faraday shield is arranged between the coil and the dielectric window. An RF generator is configured to supply RF power to the coil.

In other features, a capacitor is connected to one of the coil and the Faraday shield to adjust a position of a voltage standing wave along the coil. A tuning circuit is arranged between the RF generator and the coil. The tuning circuit includes a first variable capacitor including a first end connected to the RF generator and a second end; a second variable capacitor including a first end connected to the second end of the first variable capacitor; and a third variable capacitor including a first end and a second end. The first end of the third variable capacitor is connected to the second end of the first variable capacitor and the first end of the second variable capacitor and the second end of the third variable capacitor is connected to the coil.

In other features, the coil includes a first end and a second end. The tuning circuit is connected to the first end. The second end is connected to the Faraday shield. The second end corresponds to a center tap of the coil. A capacitor includes one end connected to the second end and an opposite end connected to a fixed reference potential.

In other features, the coil includes a first end and a second end. The tuning circuit is connected to the first end of the coil. The coil is coupled by stray capacitance to the Faraday shield.

In other features, a first capacitor includes a first end connected to the Faraday shield and a second end connected to a fixed reference potential.

In other features, a first capacitor includes a first end connected to the coil and a second end connected to a fixed reference potential.

In other features, a first capacitor includes a first end connected to the Faraday shield and a second end connected to a fixed reference potential. A second capacitor including a first end connected to the coil and a second end connected to a fixed reference potential.

In other features, the coil includes a first end and a second end. The tuning circuit is connected to the first end of the coil. The second end of the coil is connected to the Faraday shield. The coil is coupled by stray capacitance to the Faraday shield.

In other features, the second end corresponds to a center tap of the coil. A capacitor includes one end connected to the second end and an opposite end connected to a fixed reference potential.

In other features, a capacitor includes a first end connected to the Faraday shield and a second end connected to a fixed reference potential.

In other features, a first capacitor includes one end connected to the second end and an opposite end connected to a fixed reference potential. A second capacitor includes a first end connected to the Faraday shield and a second end connected to a fixed reference potential.

In other features, the Faraday shield comprises a wire mesh.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 6A is an electrical schematic and functional block diagram of another example of the coil, the tuning circuit and the RF-powered Faraday shield according to the present disclosure; and FIG. 6B is a graph illustrating a voltage standing wave for FIG. 6A.

In the drawings, reference numbers may be reused to identify similar and/or identical elements.

DETAILED DESCRIPTION

Figure 1A:
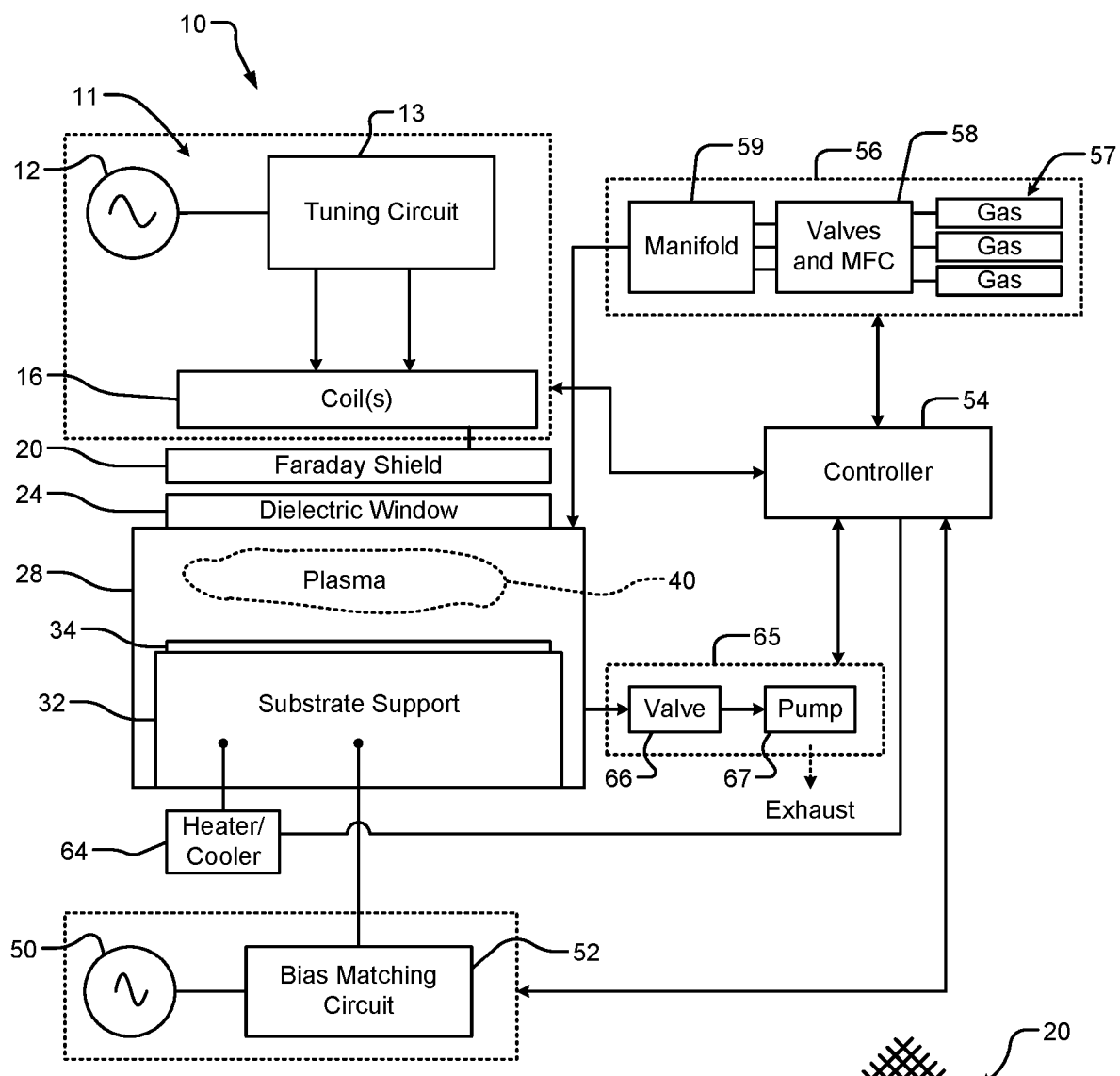
FIG. 1A is a functional block diagram of an example of a substrate processing system according to the present disclosure.

Referring now to FIG. 1A, an example of a substrate processing system 10 according to the present disclosure is shown. The substrate processing system 10 includes an RF generator 11. In some examples, the RF generator 11 includes an RF source 12 and a tuning circuit 13. The tuning circuit 13 tunes an output of the RF source 12 to a desired frequency and/or a desired phase and matches an impedance of a coil 16. In some examples, the output of the RF source 12 is 50 Ohms, although other values may be used. While a single coil is shown, multiple coils may be used.

Figure 1B:
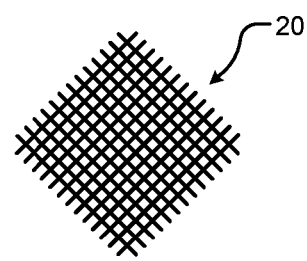
FIG. 1B is a plan view illustrating an example of a Faraday shield.

In some examples, an RF powered Faraday shield 20 may be arranged between the coil 16 and a dielectric window 24. The RF-powered Faraday shield 20 may be connected to a tap on the coil 16. In FIG. 1B, the RF-powered Faraday shield 20 includes a mesh of conductive material arranged adjacent to the dielectric window 24.

The dielectric window 24 is arranged along one side of a processing chamber 28. The processing chamber 28 further comprises a substrate support (or pedestal) 32. A substrate 34 is arranged on the substrate support 32 during processing. The substrate support 32 may include an electrostatic chuck (ESC), a mechanical chuck or other type of chuck. Process gas is supplied to the processing chamber 28 and plasma 40 is generated inside of the processing chamber 28. The plasma 40 etches an exposed surface of the substrate 34. In some examples, an RF source 50 and a bias matching circuit 52 may be used to bias the substrate support 32 during operation to further control ion energy.

A gas delivery system 56 may be used to supply an etch gas mixture to the processing chamber 28. The gas delivery system 56 may include etch gas and inert gas sources 57, a gas metering system 58 such as valves and mass flow controllers, and a manifold 59. In some examples, the process gas includes an etch gas mixture. In some examples, the etch gas includes a PZT etch gas mixture. A heater/cooler 64 may be used to heat/cool the substrate support 32 to a predetermined temperature. An exhaust system 65 includes a valve 66 and pump 67 to remove reactants from the processing chamber 28 by purging or evacuation.

A controller 54 may be used to control the etching process. The controller 54 monitors system parameters and controls delivery of the gas mixture, striking, maintaining and extinguishing the plasma, removal of reactants, supply of cooling gas, etc. Additionally, as described below in detail, the controller 54 may control various aspects of the RF generator 11, the RF source 50, and the bias matching circuit 52, etc.

Figure 2A:
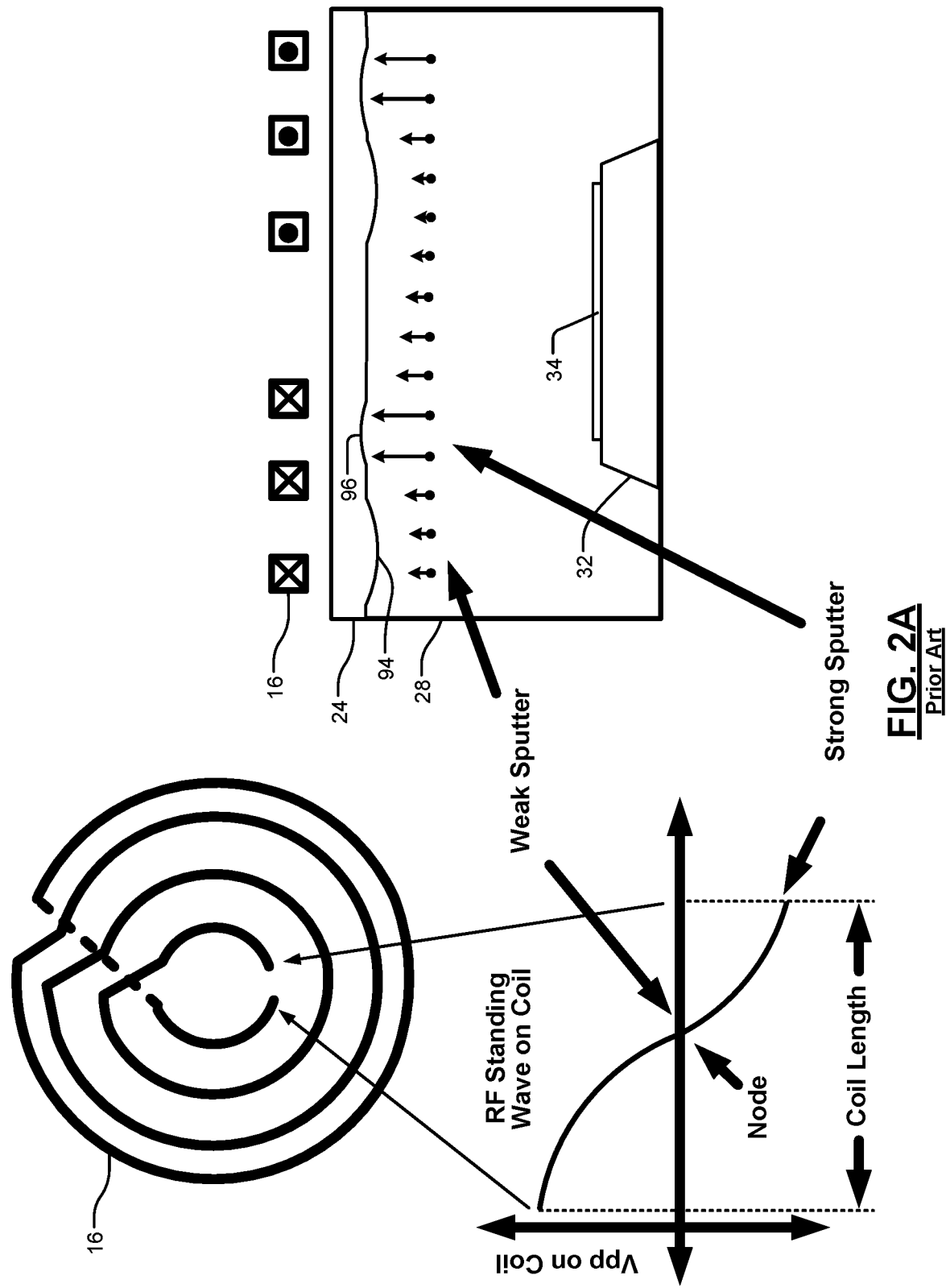
FIG. 2A illustrates an example of a voltage standing wave on the coil without the RF powered Faraday shield and corresponding deposition and sputtering on a window of the processing chamber according to the prior art.
Figure 2B:
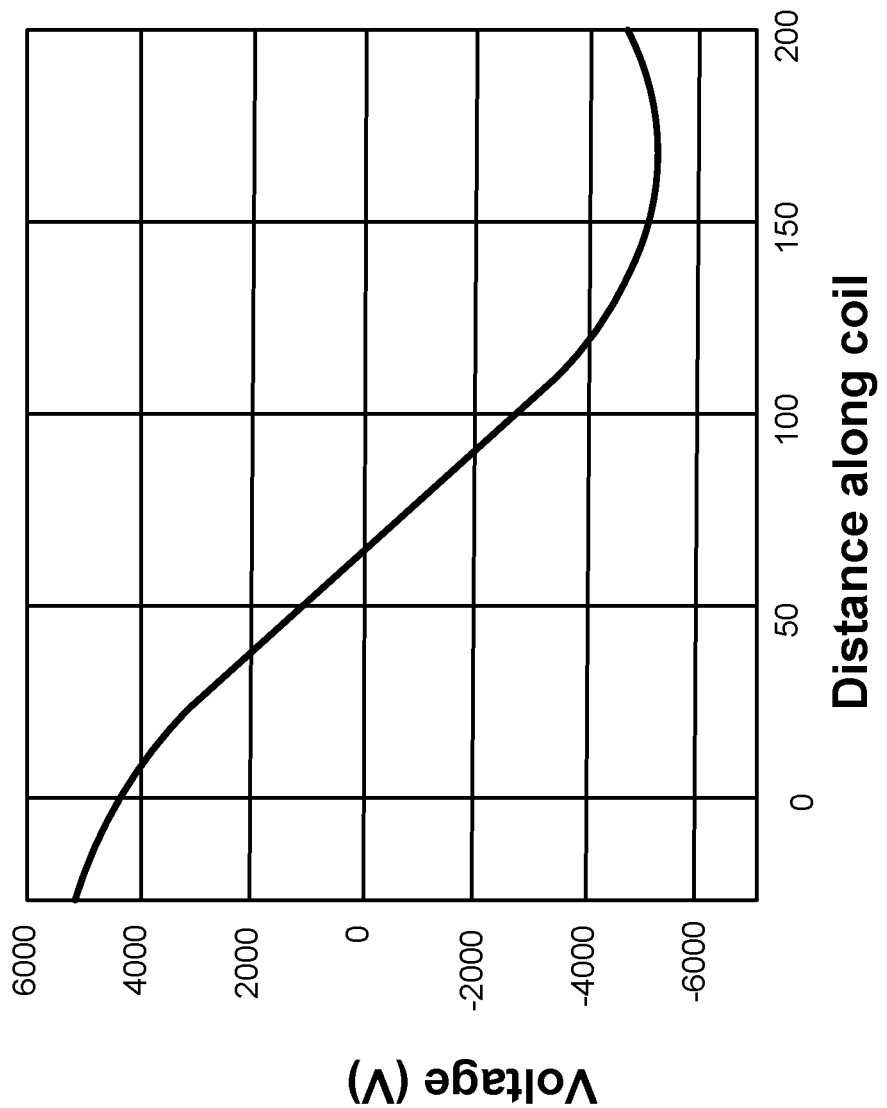
FIG. 2B is a graph illustrating an example of a voltage standing wave as a function of distance along a coil without a Faraday shield according to the prior art.

Referring now to FIGS. 2A and 2B, a voltage standing wave (VSW) on the coil is shown as a function of coil length for the applications that do not use the RF-powered Faraday shield 20. In FIG. 2A, as shown at 94 and 96, ions incident on the dielectric window have energy that varies with a magnitude of the voltage standing wave on the coil. As a result, sputtering of the dielectric window occurs in locations of the coil corresponding to high voltage magnitudes of the voltage standing wave. Deposition on the dielectric window occurs in locations of the coil corresponding to low voltage magnitudes of the voltage standing wave. In other words, byproducts of the PZT etching will be deposited on the dielectric window. In FIG. 2B, an example voltage distribution along the coil without a Faraday shield is shown. As can be appreciated, connecting the RF-powered Faraday shield 20 will change the voltage standing wave on the coil 16.

Figures 3A, 3B:
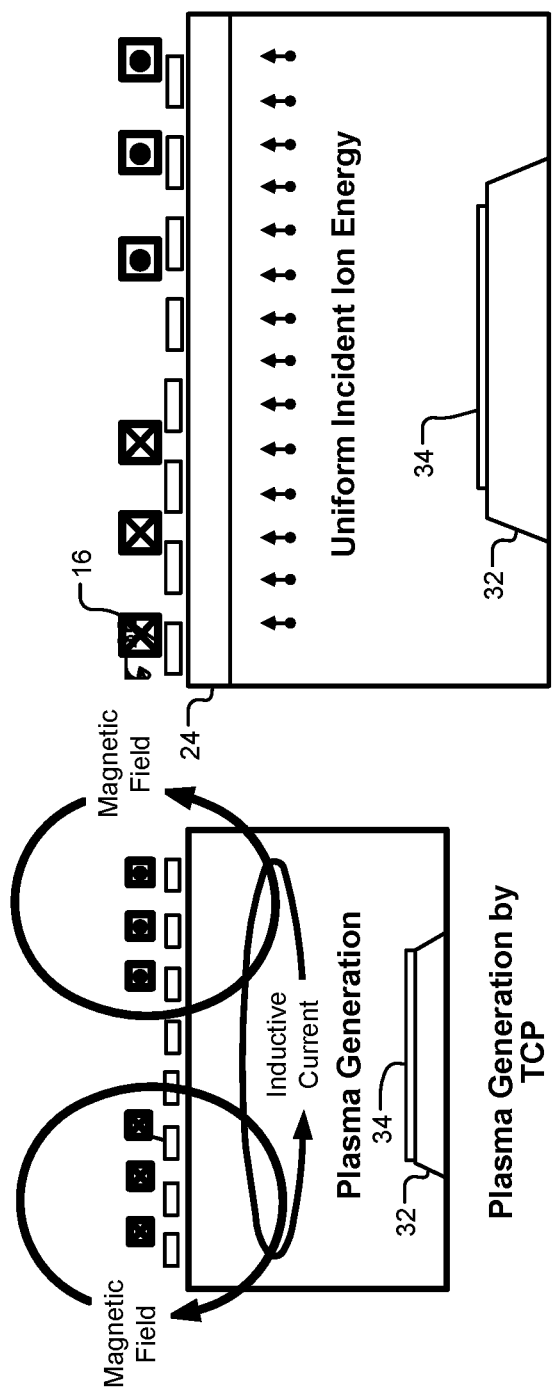
FIG. 3A illustrates an example of magnetic fields and inductive current generated by the coil with an RF-powered Faraday shield during etching according to the present disclosure.
FIG. 3B illustrates an example of ion energy during etching using the coil with the RF-powered Faraday shield according to the present disclosure.

Referring now to FIGS. 3A and 3B, operation of the coil is shown with the RF-powered Faraday shield 20. In FIG. 3A, the coils 16 and the RF-powered Faraday shield 20 induce a magnetic field and inductive current as shown. In FIG. 3B, ions have substantially uniform ion energy across the dielectric window 24 in contrast to the variable energy of the ions in FIGS. 2A and 2B.

Figures 4A, 4B:
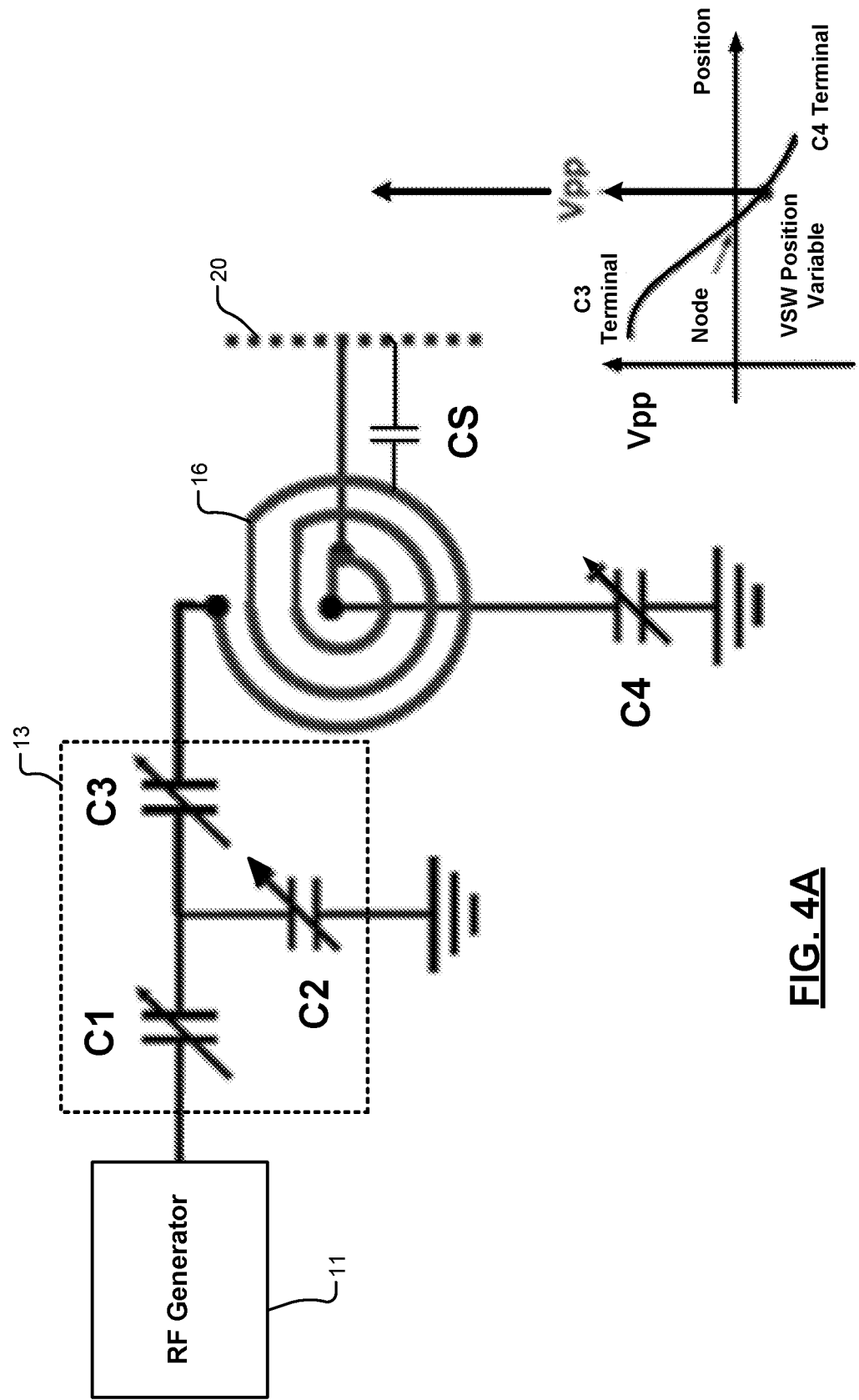
FIG. 4A is an electrical schematic and functional block diagram of an example of the coil, the tuning circuit and the RF-powered Faraday shield according to the present disclosure.
FIG. 4B is a graph illustrating a voltage standing wave for FIG. 4A.

Referring now to FIGS. 4A and 4B, connection of the RF-powered Faraday shield 20 to the coil 16 is shown. In FIG. 4A, the tuning circuit 13 is shown to include variable capacitors C1, C2 and C3. One terminal of the variable capacitor C1 is connected to an output of the RF generator 11. Another terminal of the variable capacitor C1 is connected to terminals of the variable capacitors C2 and C3. Another terminal of the variable capacitor C2 is connected to a fixed reference potential such as ground. Another terminal of the variable capacitor C3 is connected to one end of the coil 16. An opposite end of the coil 16 is connected to a variable capacitor C4. The RF-powered Faraday shield 20 is also connected to the coil 16 at a tap location between opposite ends of the coil 16. The tap location of the RF-powered Faraday shield 20 may be varied to achieve optimum RF power and/or to vary a location of the VSW. Stray capacitance CS is shown between the coil 16 and the RF-powered Faraday shield 20. In FIG. 4B, a voltage Vpp is shown along a length of the coil 16.

Figure 5:
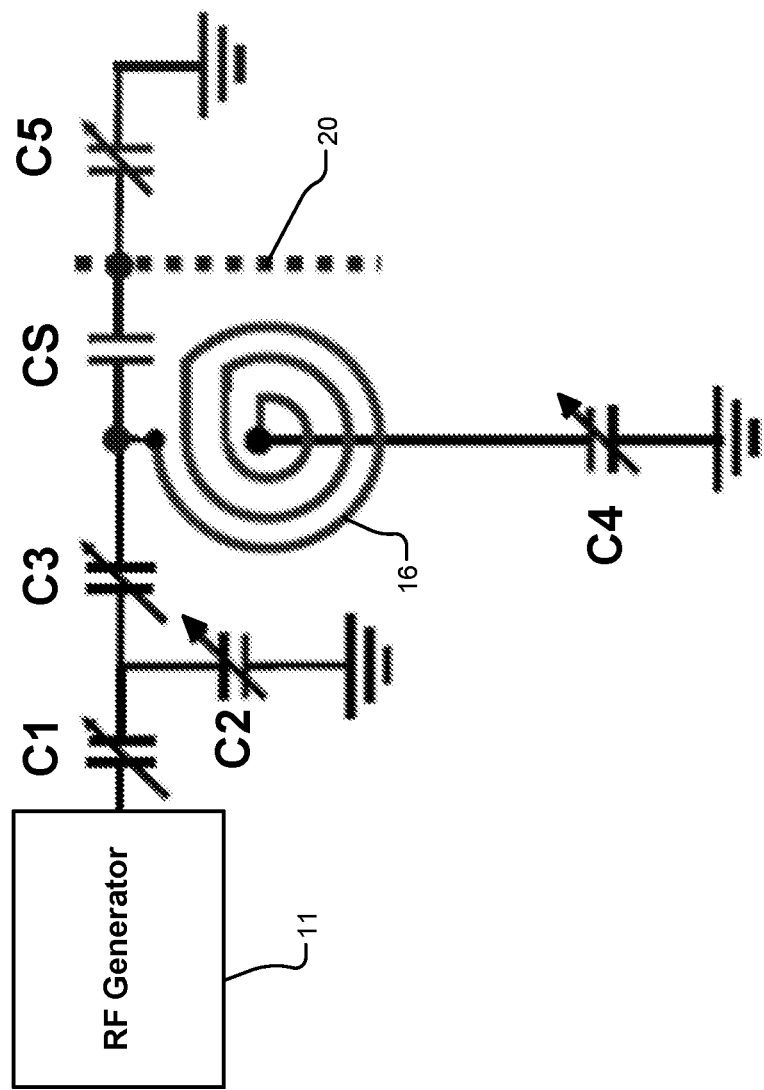
FIG. 5 is an electrical schematic and functional block diagram of another example of the coil, the tuning circuit and the RF-powered Faraday shield according to the present disclosure.

Referring now to FIG. 5, another example of the RF-powered Faraday shield 20 is shown. The RF-powered Faraday shield 20 is coupled by stray capacitance CS to the coil 16. Alternately, a fixed or variable capacitor C6 (not shown) may be used to couple the RF-powered Faraday shield 20 to the coil 16. A variable capacitor C5 may be used to adjust the effect of the RF-powered Faraday shield 20 and/or to adjust a location of the VSW. In some examples, the variable capacitor C5 has a capacitance in a range between 8 pF and 650 pF, although other values may be used.

Referring now to FIGS. 6A and 6B, another example of the RF-powered Faraday shield 20 is shown. In FIG. 6A, the RF-powered Faraday shield 20 is directly connected to a tap location between opposite ends of the coil 16. The RF-powered Faraday shield 20 is also coupled to the coil 16 by stray capacitance CS. A variable capacitor C5 is connected to the RF-powered Faraday shield 20. In FIG. 6B, the voltage Vpp is shown along the length of the coil between the terminal corresponding to the variable capacitor C3 and the terminal corresponding to the capacitor C4. The RF-powered Faraday shield 20 is supplied directly by RF voltage on the coil 16. The VSW can be adjusted using the variable capacitor C5.

By using the RF-powered Faraday shield, byproduct deposition on the dielectric window is significantly reduced during etching. In some examples, the etching includes PZT etching. Since the RF-powered Faraday shield voltage is reduced, RF coupling to the dielectric window is also reduced. As a result, performance and repeatability of the process improves. As can be appreciated, the variable capacitors can be fixed capacitors and vice versa.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing system configured to etch piezoelectric films, the substrate processing system comprising:
   a processing chamber including a dielectric window and a substrate support arranged therein to support a substrate;
   a coil arranged outside the processing chamber adjacent to the dielectric window;
   an RF generator configured to supply RF power to the coil;
   a Faraday shield arranged between the coil and the dielectric window, wherein a node of the Faraday shield is directly connected to a tap location of the coil, the tap location being between opposite ends of the coil; and
   a circuit including only a first capacitor having a first end directly connected to the node of the Faraday shield and a second end connected to a fixed reference potential wherein the first capacitor is configured to alter a location of a voltage standing wave along the coil.

2. The substrate processing system of claim 1, further comprising a tuning circuit arranged between the RF generator and the coil.

3. The substrate processing system of claim 2, wherein the tuning circuit includes:
   a first variable capacitor including a first end connected to the RF generator and a second end;
   a second variable capacitor including a first end connected to the second end of the first variable capacitor; and
   a third variable capacitor including a first end and a second end, wherein the first end of the third variable capacitor is connected to the second end of the first variable capacitor and the first end of the second variable capacitor and the second end of the third variable capacitor is connected to the coil.

4. The substrate processing system of claim 2, wherein:
   the coil includes a first end and a second end; and
   the tuning circuit is connected to the first end of the coil.

5. The substrate processing system of claim 2, wherein:
   the coil includes a first end and a second end;
   the tuning circuit is connected to the first end of the coil; and
   the coil is coupled by stray capacitance to the Faraday shield.

6. The substrate processing system of claim 5, further comprising a fourth variable capacitor including one end connected to the second end of the coil and an opposite end connected to a fixed reference potential.

7. The substrate processing system of claim 1, wherein the Faraday shield comprises a wire mesh.

* * * * *